(12) United States Patent
Huang

(10) Patent No.: US 7,576,013 B2
(45) Date of Patent: Aug. 18, 2009

(54) METHOD OF RELIEVING WAFER STRESS

(75) Inventor: Jui-Tsen Huang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 247 days.

(21) Appl. No.: 10/710,662

(22) Filed: Jul. 27, 2004

(65) Prior Publication Data

US 2006/0024921 A1    Feb. 2, 2006

(51) Int. Cl.
H01L 21/31    (2006.01)
H01L 21/469   (2006.01)

(52) U.S. Cl. .............................. 438/761; 257/E21.598; 257/E21.599

(58) Field of Classification Search ................. 438/515, 438/478, 460, 459, 458, 437, 424, 9, 761; 257/419, 758, E21.598, E21.599; 117/43; 33/648, 645; 361/761
See application file for complete search history.

(56) References Cited

U.S. PATENT DOCUMENTS 5,189,505 A * 2/1993 Bartelink .................... 257/419
5,401,683 A * 3/1995 Sugahara ...................... 117/43
5,447,884 A * 9/1995 Fahey et al. ................. 438/437
5,622,899 A * 4/1997 Chao et al. ...................... 438/9
5,798,568 A * 8/1998 Abercrombie et al. ....... 257/758
6,181,569 B1 * 1/2001 Chakravorty ................ 361/761
6,571,485 B1 * 6/2003 Yu et al. ........................ 33/645
6,828,211 B2 * 12/2004 Chi ............................. 438/424

* cited by examiner

Primary Examiner—Davienne Monbleau
Assistant Examiner—Monica D Harrison
(74) Attorney, Agent, or Firm—Jianq Chyun IP Office

(57) ABSTRACT

A method of relieving wafer stress is provided. A wafer is provided, wherein at least a dielectric layer has already formed over the wafer and the wafer has a first and a second area. At least no circuits are formed on the dielectric layer within the first area. Thereafter, openings are formed in the dielectric layer within the first area. A material layer is formed over the dielectric layer. Thus, pits are formed on the surface of the material layer at locations above the openings. Through the pits on the material layer, stress within the material layer is relieved and hence the amount of stress conferred to the wafer is reduced.

14 Claims, 5 Drawing Sheets

METHOD OF RELIEVING WAFER STRESS

BACKGROUND OF INVENTION

1. Field of the Invention

The present invention relates to a semiconductor fabrication process. More particularly, the present invention relates to a method of relieving wafer stress.

2. Description of the Related Art

At present, most semiconductor devices are fabricated on silicon wafers. To increase productivity and lower production cost, the diameter of wafers has been increased steadily from 4, 5, 6, 8 inches to 12 inches so that more chips can be fabricated from a single wafer.

In most semiconductor fabrication processes, a continuous film layer first deposited over a wafer before performing a photolithographic and etching process to pattern the film. For example, in the process of fabricating metallic interconnects, a dielectric layer is formed over a wafer and then patterned to form a via opening or a trench before depositing metallic material into the via opening or the trench. When the deposited film induces stress in the wafer due to some processing factors (such as a chemical-mechanical polishing operation), the entire wafer may warp. If such wafer stress is not relieved in time, subsequently processing operations is likely to be affected.

FIGS. 1A through 1C are schematic cross-sectional views showing the steps for fabricating conventional metallic interconnects. First, as shown in FIG. 1A, a wafer 100 having a dielectric layer 102 with a plurality of contacts/vias 104 therein is provided. A dielectric layer 106 is formed over the entire wafer 100 to cover the dielectric layer 102 and the contacts/vias 104. Because the dielectric layer 106 may accumulate some internal stress, the wafer 100 is slightly warped.

As shown in FIG. 1B, a photolithographic process is carried out to form a patterned photoresist layer 108 over the dielectric layer 106. The patterned photoresist layer 108 exposes a portion of dielectric layer 106 where trenches are required. In other words, the photoresist layer 108 exposes the locations for forming the desired metallic lines.

As shown in FIG. 1C, the exposed dielectric layer 106 is etched to form a plurality of openings 110. Because the dielectric layer 106 is no longer a continuous sheet after removing a portion of the dielectric layer 106 to form the openings 110, internal stress is relieved so that the wafer returns to its former warp-free state.

In the aforementioned process, the patterned photoresist layer 108 is formed over a warped dielectric layer 106. Because the wafer 100 will return to its warp-free state as soon as the opening 110 is formed in the dielectric layer 106, the openings 110 may shift relative to the intended positions. As a result, misalignment of the contacts/vias 104 occurs quite frequently.

Furthermore, the misalignment problem aggravates from the warping center towards the edge of a wafer. Hence, the misalignment problem is particularly serious for a wafer with a larger diameter. For a chips lying in the peripheral region of a wafer, the situation may be so serious that the metallic interconnect process fails to link up a metallic line with a corresponding contact or via. When this happens, performance of the device will deteriorate and yield of the chip will drop.

SUMMARY OF INVENTION

Accordingly, at least one objective of the present invention is to provide a stress relieving method for a wafer capable of relieving internal stress within a highly stressed film layer above the wafer.

At least a second objective of this invention is to provide a stress relieving method for a wafer capable of preventing any misalignment after a photolithographic process due to a warping of the wafer.

To achieve these and other advantages and in accordance with the purpose of the invention, as embodied and broadly described herein, the invention provides a stress relieving method for a wafer. A wafer is provided, wherein at least a dielectric layer has already formed over the wafer and the wafer having a first and a second area. At least no circuits are formed on the dielectric layer within the first area. Thereafter, openings are formed in the dielectric layer within the first area. A material layer is formed over the dielectric layer, wherein the material layer is fabricated from a dielectric material or a metal material. Thus, pits are formed on the surface of the material layer at locations above the first opening. Through the pits on the material layer, stress within the material layer is relieved and hence the amount of stress conferred to the wafer is reduced.

This invention also provides an alternative stress relieving method for a wafer. A wafer is provided, wherein at least a dielectric layer has already formed over the wafer and the wafer having a first area and a second area. At least no circuits are formed on the dielectric layer within the first area. Thereafter, a material layer is formed over the dielectric layer, wherein the material layer is fabricated from a dielectric material or a metal material. A plurality of openings is formed in the material layer within the first area. These openings absorb stress within the material layer so that the amount of stress conferred to the wafer is reduced.

Accordingly, by breaking up the high stress film layer (the material layer) into a sheet with discontinuous surface and height difference, this invention relieves the stress within the film layer and prevents the warping of the wafer. Therefore, misalignment of photoresist pattern after a photolithographic process is avoided. Furthermore, no additional photomask is required and hence there is no added complexity to the fabrication process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
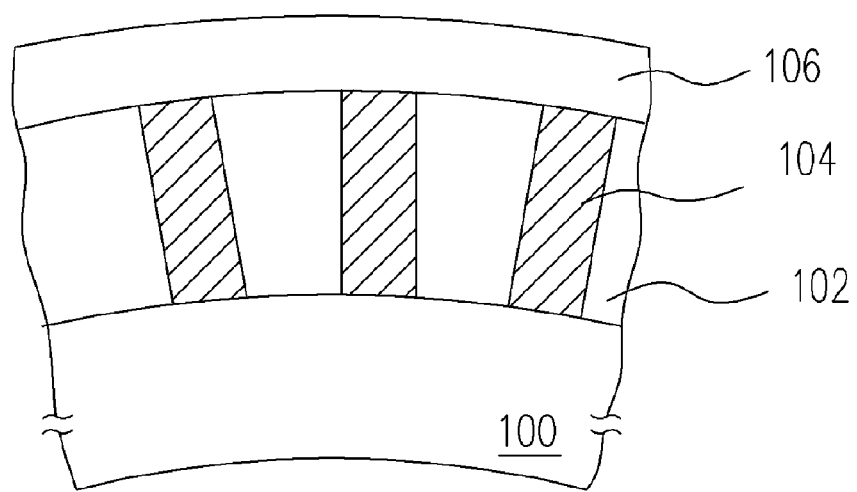
FIGS. 1A through 1C are schematic cross-sectional views showing the steps for fabricating conventional metallic interconnects.
Figure 1B:
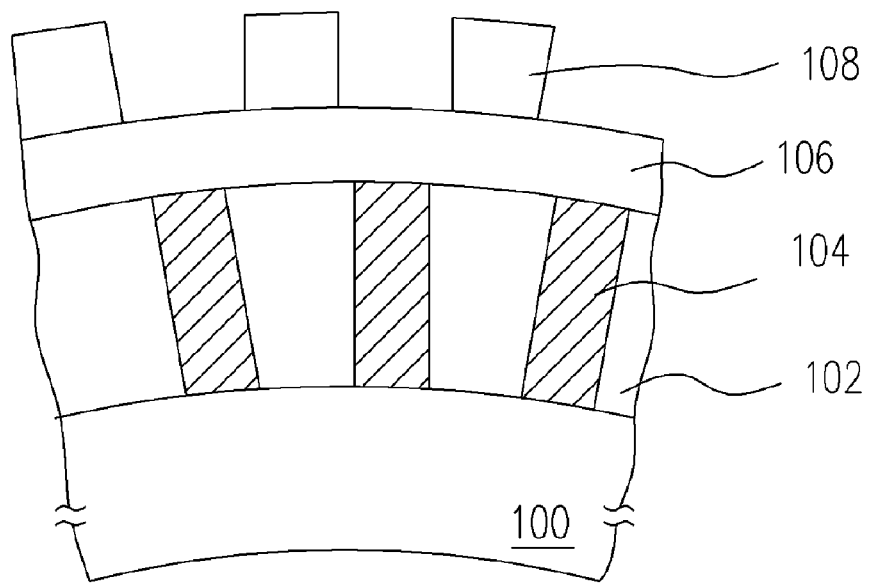
Figure 1C:
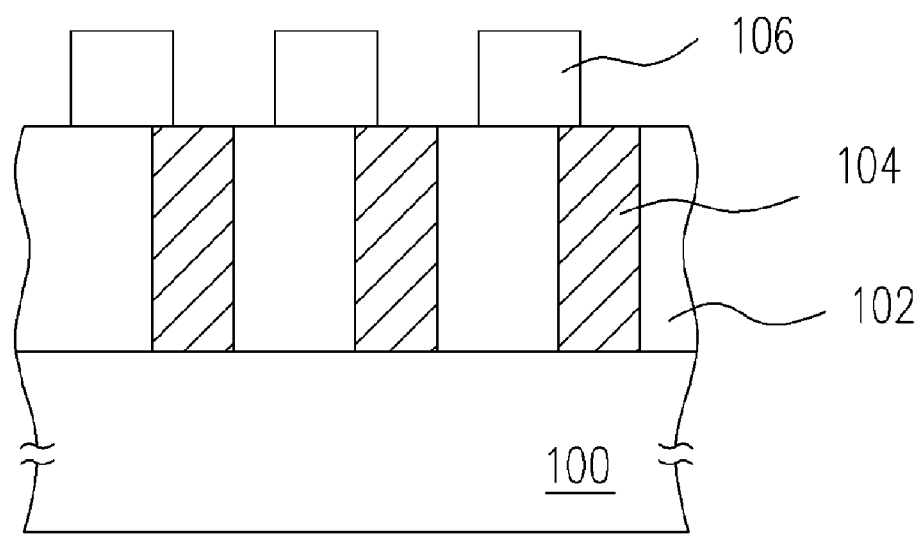

Reference will now be made in detail to the present preferred embodiments of the invention, examples of which are illustrated in the accompanying drawings. Wherever possible, the same reference numbers are used in the drawings and the description to refer to the same or like parts.

Figure 2A:
FIGS. 2A through 2C are schematic cross-sectional views showing the steps for relieving the stress within a wafer according to a first preferred embodiment of this invention.
Figure 2B:
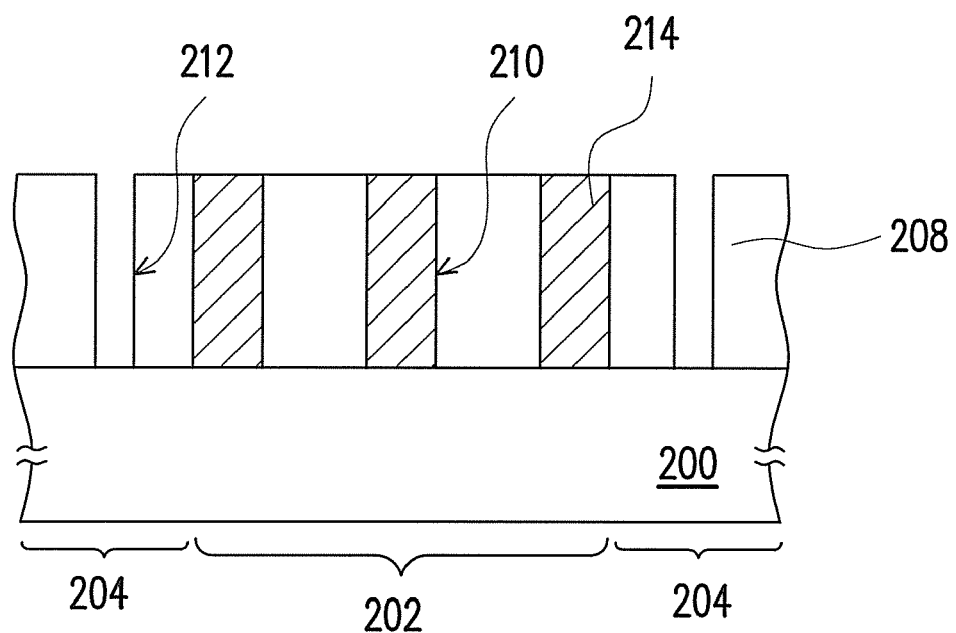
Figure 2C:
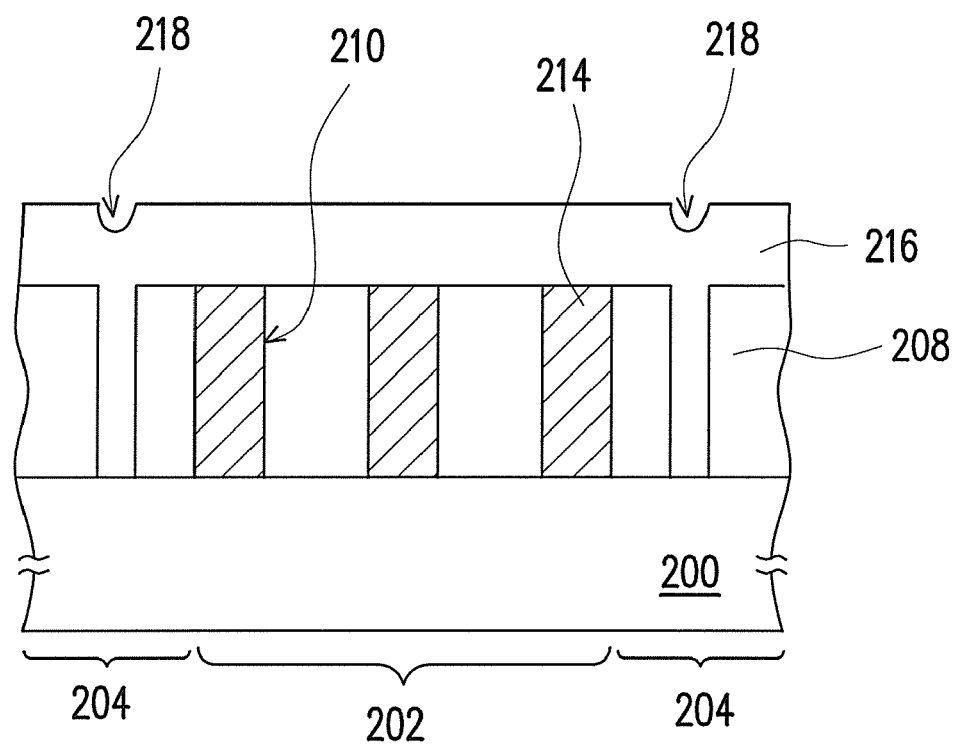

FIGS. 2A through 2C are schematic cross-sectional views showing the steps for relieving the stress within a wafer according to a first preferred embodiment of this invention. The stress relieving method can be applied to a metallic interconnect fabrication process. To simplify description and prevent the incorporation of any unnecessary restrictions to this invention, some structure components and their description are omitted below.

As shown in FIG. 2A, at least a dielectric layer 208 is formed on a wafer 200. Wherein the dielectric layer 208 is a silicon oxide layer, a silicon nitride layer or other common dielectric material layer, for example. According to the type of material chosen, the dielectric layer 208 is formed in a chemical vapor deposition process or a spincoating process, for example. In additional, the wafer 200 has an area 202 and another area 204. The area 202 is, for example, a die area with semiconductor devices (not shown) thereon. At least no circuits are formed on the dielectric layer 208 with area 204, and the area 204 is the scribe line on the wafer, for example.

As shown in FIG. 2B, a plurality of openings 210 are formed in the dielectric layer 208 within the area 202. In the meantime, a plurality of openings 212 is also formed in the dielectric layer 208 within the area 204. The openings 210 and 212 are formed, for example, by performing photolithographic and etching processes. Thereafter, material is deposited into the openings 210 to form a material layers 214. The material layers 214 are fabricated using metallic or other conductive substances. In the metallic interconnect fabrication process, the material layers 214 serves as via plugs. Hence, the material layers 214 are preferably fabricated from tungsten or copper.

As shown in FIG. 2C, a material layer 216 is formed over the dielectric layer 208, wherein the material layer is fabricated from a dielectric material or a metal material, for example. Due to the processing conditions, the material layer 216 may retain strong residual stress. Because the openings 212 within the area 204 has no material fillings, pits 218 are formed on the material layer 216 at locations above the openings 212 so that the material layer 216 has an irregular upper surface.

The aforementioned stress relieving method for wafer includes forming a plurality of openings 212 in the area 204 without any circuits so that a material layer 216 deposited over the wafer contains pits 218. Hence, the material layer 216 no longer forms a continuous smooth surface. Through the pits 218, internal stress within the material layer 216 is relieved so that the wafer is prevented from warping. As a result, misalignment of the patterns formed by a subsequent photolithographic and etching processes due to warping can be avoided.

Furthermore, the openings 212 for relieving stress and the openings 210 for fabricating semiconductor devices may be formed in a single photolithographic/etching process. Therefore, the same number of masks as in a conventional process is used. In other words, this invention can be implemented to relieve stress within a film layer and prevent the wafer from warping without adding any complexity to the fabricating process.

In another embodiment of this invention, different steps are carried out to foster the same stress relieving function. Similarly, to simplify description and prevent the incorporation of any unnecessary restrictions to this invention, some structure components and their description are omitted below. Furthermore, any elements identical to the first embodiment are labeled identically.

Figure 3A:
FIGS. 3A through 3D are schematic cross-sectional views showing the steps for relieving the stress within a wafer according to a second preferred embodiment of this invention.

FIGS. 3A through 3D are schematic cross-sectional views showing the steps for relieving the stress within a wafer according to a second preferred embodiment of this invention. As shown in FIG. 3A, at least a dielectric layer 208 is formed on a wafer 200 and the wafer 200 has an area 202 and another area 204. The area 202 is, for example, a die area with semiconductor devices (not shown) thereon. At least no circuits are formed on the dielectric layer 208 with the area 204, and the area 204 is scribe line on the wafer, for example.

Figure 3B:
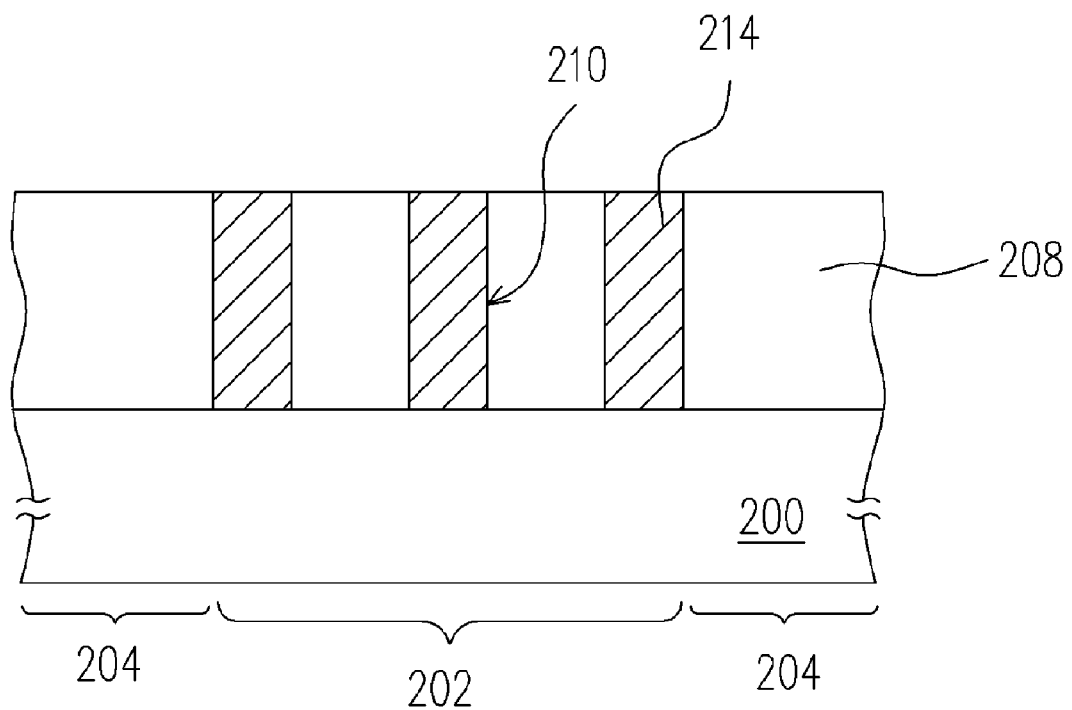

As shown in FIG. 3B, a plurality of openings 210 is formed in the dielectric layer 208 within the area 202. Thereafter, material is deposited into the openings 210a to form material layers 214. The material layers 214 are fabricated using metallic or other conductive substances. In the metallic interconnect fabrication process, the material layers 214 serves as via plugs. Hence, the material layers 214 are preferably fabricated from tungsten or copper.

Figure 3C:
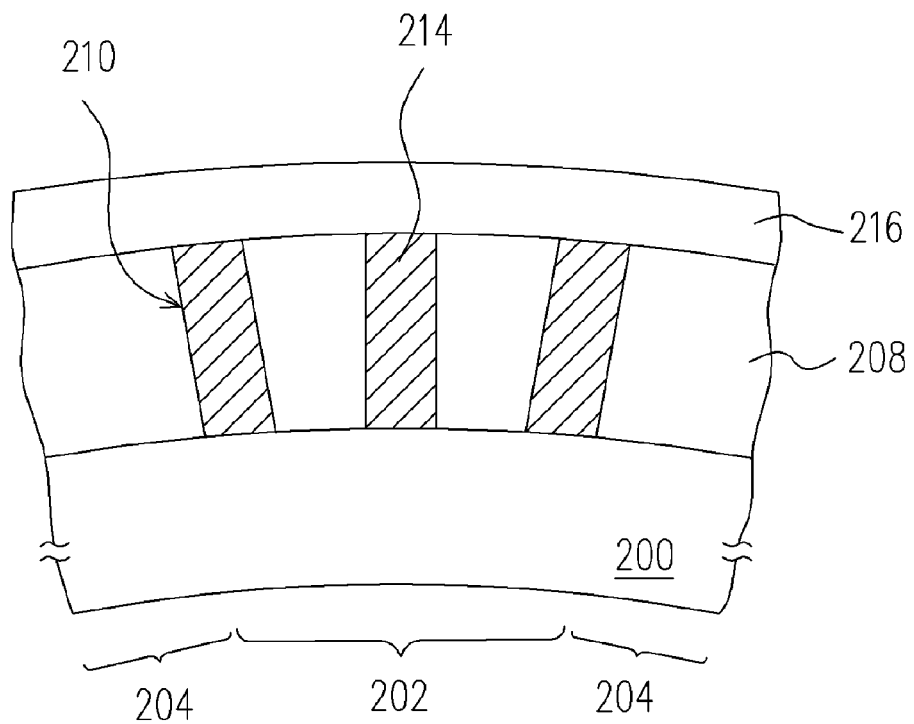
Figure 3D:
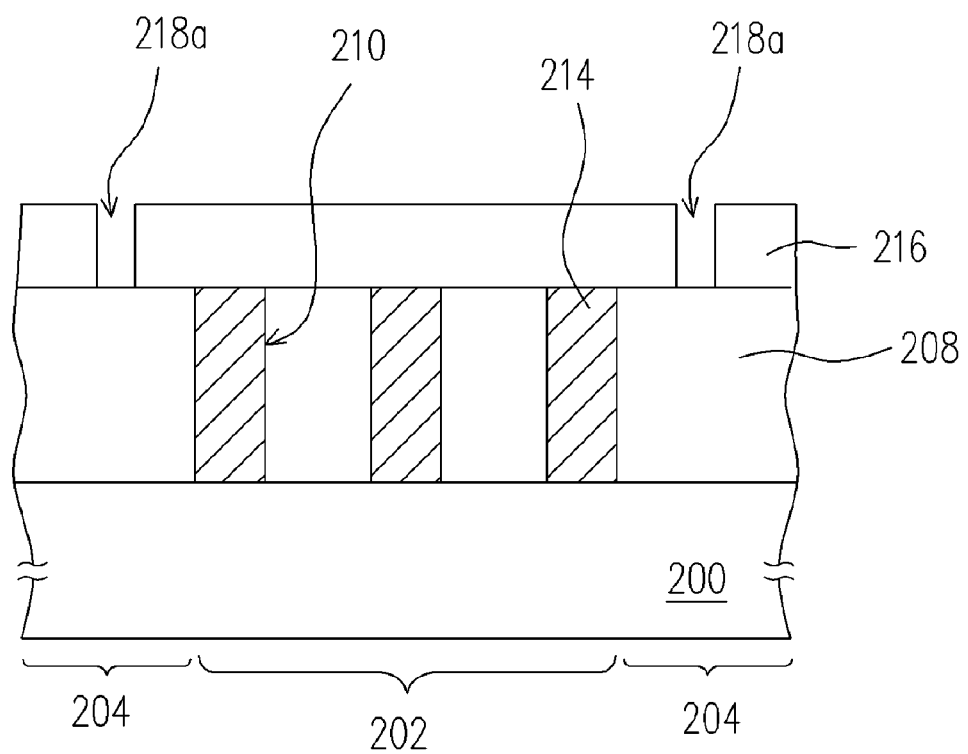

As shown in FIG. 3C, a material layer 216 is formed over the dielectric layer 208 covering the entire wafer 200, wherein the material layer 216 is fabricated from a dielectric material or a metal material, for example. As shown in FIG. 3D, a plurality of openings 218a are formed in the material layer 216 within the area 204 so that the smooth material layer 216 is patterned. The openings 218a are formed, for example, by performing photolithographic and etching processes.

The second embodiment of this invention uses a series of steps that differs from the first embodiment. However, they both use the same idea of breaking up the continuous material layer 216 to reduce stress within the material layer 216. With the internal stress within the material layer 216 removed, the wafer is prevented from warping. As a result, misalignment of the patterns formed by a subsequent photolithographic and etching processes due to warping is similarly avoided.

In the first embodiment, each opening 212 exposes a film layer (the wafer 200 in FIG. 2B) underneath the dielectric layer 208 and provides a through hole. However, the opening 212 may not reach too deep to expose the film layer underneath the dielectric layer 208 so that only a groove is formed. Similarly, the openings 218a in the second embodiment can be through holes or grooves.

Although a metallic interconnect fabrication process is used as an example in both embodiments, the applications of this invention is not limited as such. This invention can be applied to fabricate the bit lines of a memory device or some other semiconductor devices. In any case, the stress relieving method of this invention can be applied whenever a high stress film layer is formed over a wafer.

Accordingly, by breaking up the high stress film layer (the second dielectric layer) into a sheet with discontinuous surface and height difference, this invention relieves the stress within the film layer and prevents the warping of the wafer. Thus, misalignment of photoresist pattern after a photolithographic process is avoided.

Furthermore, no additional photomask is required. Hence, there is no added complexity to the fabrication process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A stress relieving method for a wafer, comprising the steps of:
    providing a wafer with a dielectric layer thereon, wherein the wafer is divided into a first area and a second area such that at least no circuits are formed on the dielectric layer within the first area;
    forming a plurality of first openings in the dielectric layer within the first area; and
    forming a first material layer over the wafer, wherein the upper surface of the first material layer has pits at locations directly over the first openings, and the first material layer is a high stress dielectric layer.

2. The stress relieving method of claim 1, wherein the first area comprises a scribe line.

3. The stress relieving method of claim 1, wherein the second area comprises a region for forming a die.

4. The stress relieving method of claim 3, wherein the first area comprises a scribe line.

5. The stress relieving method of claim 1, wherein the first area and the second area are both regions for forming a die.

6. The stress relieving method of claim 1, wherein the step of forming first openings in the dielectric layer within the first area further comprises forming a plurality of second openings in the first dielectric layer within the second area at the same time and then depositing material into the second openings to form a plurality of second material layers.

7. The stress relieving method of claim 1, wherein the first opening is not deep enough to expose a film layer underneath the dielectric layer.

8. The stress relieving method of claim 1, wherein the first opening exposes a film layer underneath the dielectric layer.

9. A stress relieving method for a wafer, comprising the steps of:
    providing a wafer with a dielectric layer thereon, wherein the wafer is divided into a first area and a second area such that no circuits are formed within the first area, the first area comprising a scribe line, the second area comprising a region for forming a die, wherein there is no opening formed in the dielectric layer within the first area;
    forming a first material layer over the wafer to cover the dielectric layer; and
    forming a plurality of first openings in the first material layer within the first area.

10. The stress relieving method of claim 9, wherein the first opening is not deep enough to expose the dielectric layer.

11. The stress relieving method of claim 9, wherein the first opening exposes the dielectric layer.

12. The stress relieving method of claim 9, wherein before forming the first material layer over the wafer, further comprises:
    forming a plurality of second openings in the dielectric layer within the second area; and
    depositing material into the second openings to form a plurality of second material layers.

13. The stress relieving method of claim 9, wherein the first material layer is fabricated from a dielectric material or a metal material.

14. The stress relieving method of claim 9, wherein the first material layer is a high stress dielectric layer.

* * * * *